United States Patent
Park et al.

(10) Patent No.: US 9,401,680 B2
(45) Date of Patent: Jul. 26, 2016

(54) TEMPERATURE DEPENDENT AMPLIFIER BIASING

(71) Applicant: QUALCOMM Incorporated, San Diego, CA (US)

(72) Inventors: Jungdong Park, San Jose, CA (US); Cheng-Han Wang, San Jose, CA (US); Hong Sun Kim, San Jose, CA (US); Mohammad Bagher Vahid Far, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 62 days.

(21) Appl. No.: 14/158,318

(22) Filed: Jan. 17, 2014

(65) Prior Publication Data

US 2015/0207466 A1    Jul. 23, 2015

(51) Int. Cl.
| | |
|---|---|
| H03F 3/04 | (2006.01) |
| H03F 1/30 | (2006.01) |
| H03F 3/193 | (2006.01) |
| H03F 3/195 | (2006.01) |
| H03F 3/24 | (2006.01) |

(52) U.S. Cl.
CPC ............ *H03F 1/301* (2013.01); *H03F 3/193* (2013.01); *H03F 3/195* (2013.01); *H03F 3/245* (2013.01); *H03F 1/30* (2013.01); *H03F 2200/18* (2013.01); *H03F 2200/294* (2013.01); *H03F 2200/411* (2013.01); *H03F 2200/447* (2013.01); *H03F 2200/451* (2013.01)

(58) Field of Classification Search
CPC ..... H03F 1/302; H03F 1/30; H03F 2200/447; H03F 1/301; H03F 3/19; H03F 2200/18; H03F 1/0261; H03F 3/343; H03F 3/345; H03G 3/3042; H03G 3/3047; G05F 3/265
USPC .......................................... 330/285, 289, 296
See application file for complete search history.

(56) References Cited

U.S. PATENT DOCUMENTS

| | | | |
|---|---|---|---|
| 5,448,158 A | 9/1995 | Ryat | |
| 5,699,014 A | 12/1997 | Haefner et al. | |
| 6,346,848 B1 | 2/2002 | Shkap | |
| 7,432,763 B2 | 10/2008 | Leete | |
| 7,443,226 B1 | 10/2008 | Holloway et al. | |
| 7,443,241 B2 * | 10/2008 | Fong et al. | 330/254 |
| 7,449,958 B1 * | 11/2008 | Voo | 330/296 |
| 7,471,152 B2 | 12/2008 | Jiang et al. | |
| 2008/0032661 A1 | 2/2008 | Ojo et al. | |

(Continued)

OTHER PUBLICATIONS

Lee, H.D. et al., "A Wideband CMOS Variable Gain Amplifier With an Exponential Gain Control", IEEE Transactions on Microwave Theory and Techniques, Jun. 2007, vol. 55 (6), pp. 1363-1373.

(Continued)

*Primary Examiner* — Khanh V Nguyen
(74) *Attorney, Agent, or Firm* — Toler Law Group, PC

(57) ABSTRACT

An apparatus includes a first bias circuit configured to generate a first current that varies with temperature according to a first slope. The apparatus also includes a second bias circuit configured to generate a second current that varies with temperature according to a second slope. The apparatus further includes a low noise amplifier including a transconductance stage that is responsive to an output of the first bias circuit. The apparatus also includes a load coupled to an output of the low noise amplifier and responsive to an output of the second bias circuit.

19 Claims, 7 Drawing Sheets

(56) References Cited

U.S. PATENT DOCUMENTS

| | | |
|---|---|---|
| 2008/0164948 A1* | 7/2008 | Pelli et al. .................... 330/288 |
| 2009/0054004 A1 | 2/2009 | Chee et al. |
| 2010/0007424 A1 | 1/2010 | Savla et al. |

OTHER PUBLICATIONS

Wu, Y. et al., "Temperature compensation design for a 2.4 GHz CMOS low noise amplifier", The 2000 IEEE International Symposium on Circuits and Systems, ISCAS, 2000, vol. 1, pp. 323-326.

International Search Report and Written Opinion for International Application No. PCT/US2015/010644, mailed Jun. 30, 2015, 16 pages.

Partial International Search Report for International Application No. PCT/US2015/010644, mailed Apr. 23, 2015, 6 pages.

Written Opinion of the International Preliminary Examining Authority—PCT/US2015/010644—ISA/EPO—Jan. 22, 2016.

* cited by examiner

602 →

| Multi-Slope PTAT Reference Current | |
|---|---|
| Temperature (°C) | Noise Figure Gain (dB) |
| -30 | 1.77 |
| -10 | 1.94 |
| 10 | 2.12 |
| 30 | 2.3 |
| 50 | 2.48 |
| 70 | 2.66 |
| 90 | 2.86 |
| 110 | 3.07 |

604 →

| Fixed-Slope PTAT Reference Current | |
|---|---|
| Temperature (°C) | Noise Figure Gain (dB) |
| -30 | 1.9 |
| -10 | 2.08 |
| 10 | 2.28 |
| 30 | 2.48 |
| 50 | 2.69 |
| 70 | 2.9 |
| 90 | 3.13 |
| 110 | 3.36 |

*FIG. 6*

TEMPERATURE DEPENDENT AMPLIFIER BIASING

FIELD

The present disclosure is generally related to reducing gain variation.

DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Wireless telephones may receive signals at a receiver. A receiver may include a low noise amplifier (LNA) to amplify signals received from an antenna. A gain of the LNA and/or a noise figure of the LNA may vary with changes in temperature. Variation in the gain and the noise figure is not desirable in highly sensitive receivers. In order to reduce the variation, a proportional-to-absolute temperature (PTAT) reference current may be provided to the LNA. A slope of the PTAT reference current with respect to temperature may be associated with a size ratio of two diodes used to generate the PTAT reference current. However, an optimal slope of the PTAT reference current may be difficult to calculate and may not be determinable until after completion of a design stage of the LNA. Additionally, providing the PTAT reference current to the LNA may not prevent instability in the receiver at low temperatures.

BRIEF DESCRIPTION OF THE DRAWINGS

FIG. 6 illustrates charts depicting noise figure gains for fixed-slope PTAT reference currents and multi-slope PTAT reference currents.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
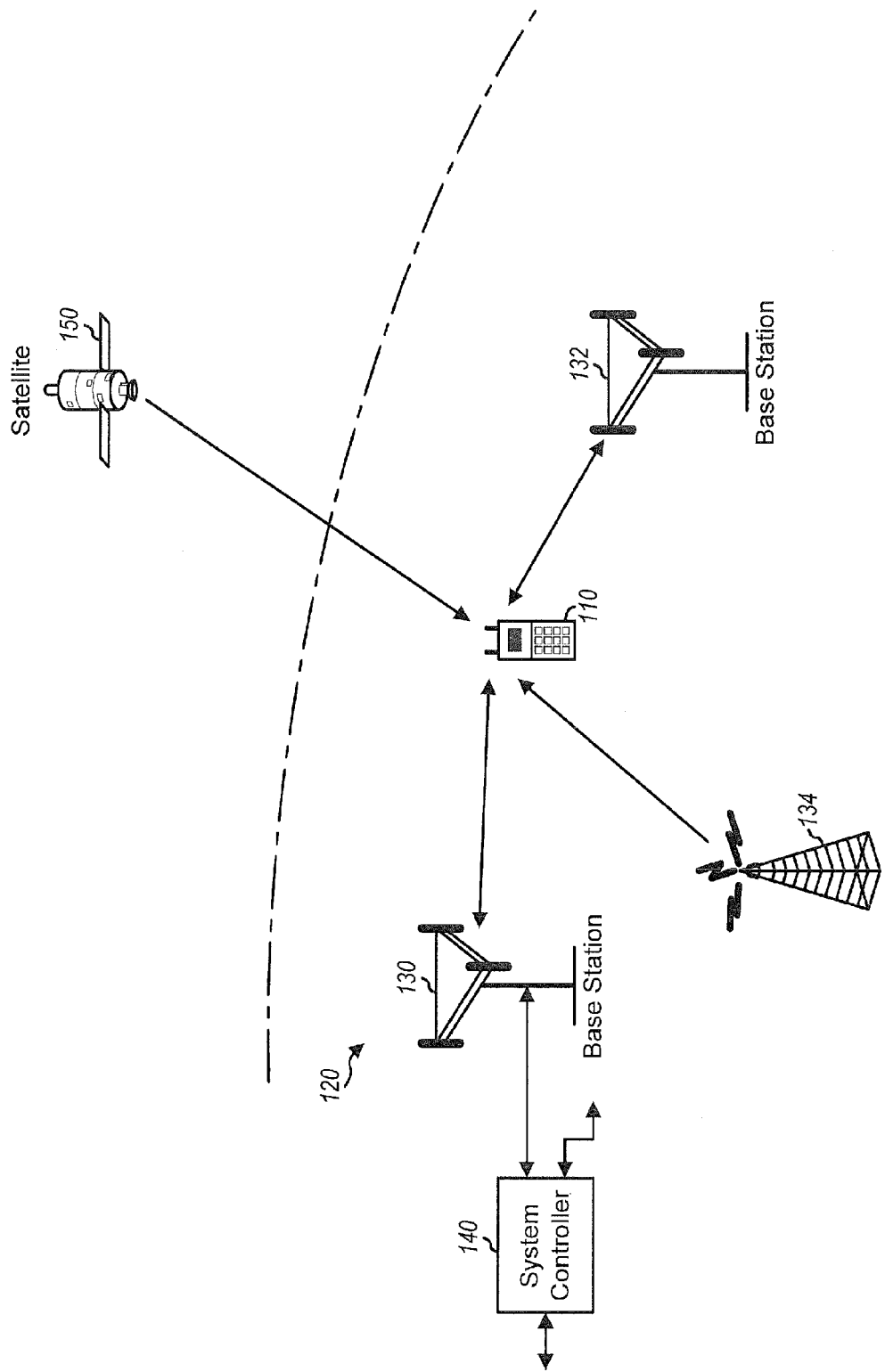
FIG. 1 shows a wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (ID-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, etc.

Figure 2:
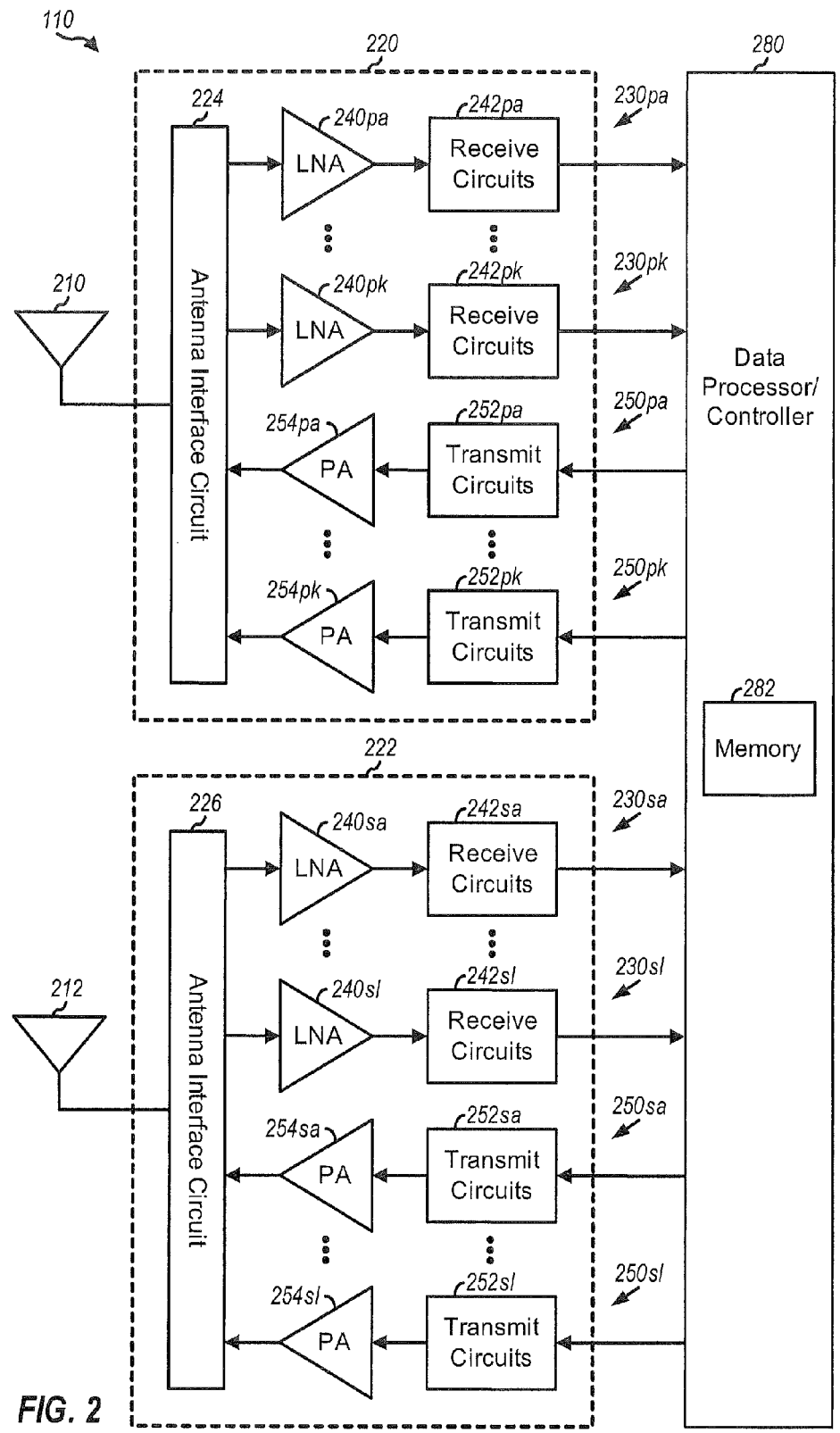
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (K) receivers 230pa to 230pk and multiple (K) transmitters 250pa to 250pk to support multiple frequency bands, multiple radio technologies, carrier aggregation, etc. Transceiver 222 includes multiple (L) receivers 230sa to 230sl and multiple (L) transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, antenna 210 receives signals from base stations and/or other transmitter stations and provides a received RF signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230*pa* is the selected receiver. Within receiver 230*pa*, an LNA 240*pa* amplifies the input RF signal and provides an output RF signal. Receive circuits 242*pa* downconvert the output RF signal from RF to baseband, amplify and filter the downconverted signal, and provide an analog input signal to data processor 280. Receive circuits 242*pa* may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230*pa*.

In the exemplary design shown in FIG. 2, each transmitter 250 includes transmit circuits 252 and a power amplifier (PA) 254. For data transmission, data processor 280 processes (e.g., encodes and modulates) data to be transmitted and provides an analog output signal to a selected transmitter. The description below assumes that transmitter 250*pa* is the selected transmitter. Within transmitter 250*pa*, transmit circuits 252*pa* amplify, filter, and upconvert the analog output signal from baseband to RF and provide a modulated RF signal. Transmit circuits 252*pa* may include amplifiers, filters, mixers, matching circuits, an oscillator, an LO generator, a PLL, etc. A PA 254*pa* receives and amplifies the modulated RF signal and provides a transmit RF signal having the proper output power level. The transmit RF signal is routed through antenna interface circuit 224 and transmitted via antenna 210. Each remaining transmitter 250 in transceivers 220 and 222 may operate in similar manner as transmitter 250*pa*.

FIG. 2 shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 may be implemented on one module, which may be an RFIC, etc. The circuits in transceivers 220 and 222 may also be implemented in other manners.

Data processor/controller 280 may perform various functions for wireless device 110. For example, data processor 280 may perform processing for data being received via receivers 230 and data being transmitted via transmitters 250. Controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Wireless device 110 may support multiple band groups, multiple radio technologies, and/or multiple antennas. Wireless device 110 may include a number of LNAs to support reception via the multiple band groups, multiple radio technologies, and/or multiple antennas.

Figure 3:
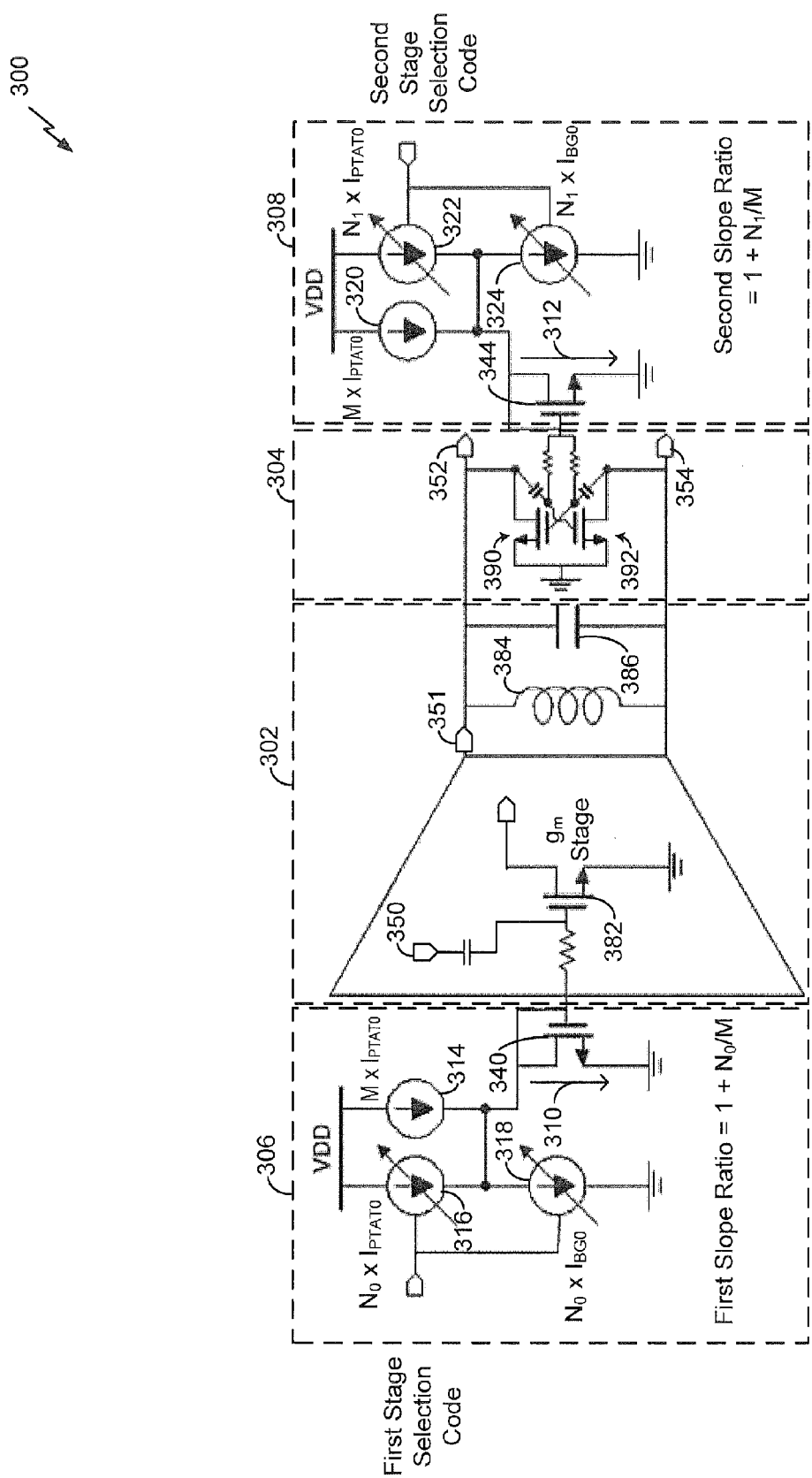
FIG. 3 is an exemplary illustrative embodiment of a circuit that is operable to reduce gain variance and/or noise figure variance of a low noise amplifier.

Referring to FIG. 3, an exemplary illustrative embodiment of a circuit 300 that is operable to reduce gain variance and/or noise figure variance of a low noise amplifier (LNA) is shown. The circuit 300 may be included in the wireless device 110 of FIGS. 1-2. The circuit 300 includes a first device 302, a second device 304, a first bias circuit 306, and a second bias circuit 308. The first device 302 may correspond to an LNA having a transconductance ($g_m$) stage, and the second device 304 may correspond to a load having a selectivity boosting circuit. The selectivity boosting circuit may include an active circuit and at least one passive circuit element. In an exemplary embodiment, the first device 302 may correspond to at least one of the LNAs 240*pa*, 240*pk*, 240*sa*, 240*sl* of FIG. 2.

In other exemplary embodiments, the first device 302 may correspond to a power amplifier, a radio frequency (RF) power amplifier, a differential power amplifier, a differential LNA, or a differential RF power amplifier.

The first device 302 (e.g., the LNA) and the second device 304 (e.g., the load that includes a selectivity boosting circuit) may be included in a front-end stage of a receiver and may be configured to amplify an input signal (e.g., a radio frequency (RF) signal) to generate differential signals. The differential signal may be provided to a later stage of the receiver for processing.

The first device 302 includes a first transistor 382 and an LC circuit (e.g., an inductor 384 coupled in parallel with a capacitor 386). The first transistor 382 may be a NMOS transistor. A gate of the first transistor 382 may be coupled to the first biasing circuit 306 via a resistor, a source of the first transistor 382 may be coupled to a first terminal 351 of the LC circuit, and a drain of the first transistor 382 may be coupled to ground.

The first transistor 382 may correspond to a transconductance ($g_m$) stage of the first device 302. The gain at the transconductance stage may be proportional to the product of the transconductance of the first transistor 382 and the resistance (e.g., load resistance) of the first transistor 382. The transconductance (and thus the gain) of the first transistor 382 may vary based on temperature. As explained below, the first bias circuit 306 may mirror a first current 310 via the first transistor 382 to reduce gain variation caused by temperature changes.

The LC circuit may be tuned to achieve high impedance and high gain at the target frequency. Although a single inductor 384 and a single capacitor 386 are depicted as the LC circuit, in other exemplary embodiments, multiple capacitors and multiple inductors may be included in the LC circuit.

The second device 304 may be coupled in parallel with the LC circuit to generate negative resistance. For example, the second device 304 may be a load comprising a selectivity boosting circuit that includes an active circuit (e.g., a second transistor 390 and a third transistor 392) and at least one passive circuit element (e.g., a pair of resistors coupled to gates of the transistors 390, 392). The second transistor 390 and the third transistor 392 may be NMOS transistors having sources that are coupled to ground. A drain of the second transistor 390 may be coupled to a first output 352 of the second device 304, and a drain of the third transistor 392 may be coupled to a second output 354 of the second device 304. A gate of the second transistor 390 may be coupled to the drain of the third transistor 392 via a capacitor, and a gate of the third transistor 392 may be coupled to the drain of the first transistor 390 via a capacitor. Thus, the second transistor 390 and the third transistor 392 may be a pair of cross-coupled transistors. The first output 352 may provide the first differential signal to the later stages of the receiver for processing, and the second output 354 may provide the second differential signal to the later stages of the receiver for processing.

The second device 304 may introduce a negative resistance (e.g., a component operating in a similar manner as a resonant-tunneling diode whereby a voltage across the component decreases as the current flowing through the component increases) to compensate for resistive losses in the LC circuit that reduce impedance and/or gain. The resistive losses may be caused by source-to-drain resistive losses in the first transistor 382, resistive losses in the inductor 384, resistive losses in the capacitor 386, or any combination thereof. The second device 304 may boost a gain (e.g., negative gain boosting) of the first device 302 by using a negative-transconductance stage to introduce an adjustable negative-transconductance to compensate for the resistive losses.

The gain at the negative-transconductance stage (e.g., the cross-coupled transistors 390, 392) may be approximately proportional to the product of the transconductance of the transistors 390, 392 and the resistance (e.g., load resistance) of the transistors 390, 392. The transconductance (and thus the gain) of the transistors 390, 392 may vary based on temperature. As explained below, the second bias circuit 308 may provide a second current 312 to the gates of the transistors 390, 392 (via resistors) to reduce gain variation caused by temperature changes.

The gain of the first device 302 (e.g., the LNA) and the gain of the second device 304 (e.g., the load) may contribute to an overall gain of the receiver. For example, one or more circuit elements of the first device 302 and/or the second device 304 may be selected (e.g., during a design phase of the receiver) to modify the gain of the receiver by a first amount or by a second amount, respectively. Additionally, the noise figure of the first device 302 and the noise figure of the second device 304 may contribute to the overall noise figure of the receiver. Contributions to the gain and to the noise figure from the devices 302, 304 may be temperature-dependent. Thus, the gain and the noise figure may vary as a function of temperature.

The first bias circuit 306 may be coupled to the first transistor 382 (e.g., the transconductance stage) to at least partially compensate for temperature-dependent gain variance and/or temperature-dependent noise figure variance caused by the first transistor 382. The first bias circuit 306 may include a first current source 314, a second current source 316, a third current source 318, and a fourth transistor 340. The first current source 314 may be a current generator configured to generate a first source current based on a PTAT reference current ($I_{PTAT0}$). For example, the first current source 314 may be configured to generate the first source current having a magnitude of the PTAT reference current ($I_{PTAT0}$) multiplied by a multiplication factor M.

The second current source 316 may be a variable current generator that is responsive to a first stage selection code to generate a second source current based on the PTAT reference current ($I_{PTAT0}$). For example, the second current source 316 may be configured to generate the second source current having a magnitude of the PTAT reference current ($I_{PTAT0}$) multiplied by a multiplication factor $N_0$. The third current source 318 may be a variable current generator that is responsive to the first stage selection code to generate a first sink current based on a band-gap reference current ($I_{BG0}$). For example, the third current source 318 may be configured to generate the first sink current having a magnitude of the band-gap reference current ($I_{BG0}$) multiplied by the multiplication factor $N_0$. Although described and illustrated as three distinct current sources 314-318, the first bias circuit 306 may be implemented using a current mirror and a digital-to-analog converter (DAC)-type configuration, as further described with reference to FIG. 4.

The first current 310 may be approximately equal to the sum of the first source current and the second source current minus the first sink current. The first bias circuit 306 may be configured to provide the first current 310 (e.g., a bias current) through the fourth transistor 340 to be mirrored via the first transistor 382, which is the main transconductance device of the LNA. Or the fourth transistor 340 and the first transistor 382 may be included in a current mirror circuit which provides a particular current level to the main device of the LNA. The first current 310 may be a slope-adjustable PTAT current. As used herein, a slope-adjustable PTAT current refers to a PTAT current having a slope (e.g., a change in current magnitude with respect to a change in temperature) that is dynamically adjustable.

The first bias circuit 306 may be configured to adjust a slope of the first current 310 by adjusting contributions of the PTAT reference current ($I_{PTAT0}$) and the band-gap reference current ($I_{BG0}$) to the first current 310 based on the first stage selection code. For example, the first bias circuit 306 may set the multiplication factor $N_0$ associated with the second current source 316 and the third current source 318 based on the first stage selection code. The first stage selection code may be a digital code that indicates a number of enabled current contributing stages within the first bias circuit 306, as further described with reference to FIG. 4. In an exemplary embodiment, the slope of the first current 310 may be linear (or substantially linear). In another exemplary embodiment, the slope of the first current 310 may be nonlinear (e.g., piecewise linear), as further described with reference to FIG. 5.

The second bias circuit 308 may be coupled to the second device 304 (e.g., the cross-coupled transistors 390, 392) to at least partially compensate for temperature-dependant gain variance and/or temperature-dependant noise figure variance caused by the second device 304. The second bias circuit 308 may include a fourth current source 320, a fifth current source 322, a sixth current source 324, and a fifth transistor 344. The fourth current source 320 may be a current generator configured to generate a third source current based on the PTAT reference current ($I_{PTAT0}$). For example, the fourth current source 320 may be configured to generate the third source current having a magnitude of the PTAT reference current ($I_{PTAT0}$) multiplied by the multiplication factor M. In an exemplary embodiment, the multiplication factor M associated with the first current source 314 may be the same as the multiplication factor M associated with the fourth current source 320. In another exemplary embodiment, the multiplication factor M associated with the first current source 314 may be different from the multiplication factor M associated with the fourth current source 320.

The fifth current source 322 may be a variable current generator that is responsive to the second stage selection code to generate a fourth source current based on the PTAT reference current ($I_{PTAT0}$). For example, the fifth current source 322 may be configured to generate the fourth source current having a magnitude of the PTAT reference current ($I_{PTAT0}$) multiplied by a multiplication factor $N_1$. The sixth current source 324 may be a variable current generator that is responsive to the second stage selection code to generate a second sink current based on the band-gap reference current ($I_{BG0}$). For example, the sixth current source 324 may be configured to generate the second sink current having a magnitude of the band-gap reference current ($I_{BG0}$) multiplied by the multiplication factor $N_1$. Although described and illustrated as three distinct current sources 320-324, the second bias circuit 308 may be implemented using a current mirror and a DAC-type configuration, as further described with reference to FIG. 4.

The second current 312 may be approximately equal to the sum of the third source current and the fourth source current minus the second sink current. The second bias circuit 308 may be configured to provide the second current 312 (e.g., a bias current) through the fifth transistor 344 of the second bias circuit 308 to be mirrored at the second device 304. For example, a portion of the second current 312 may be mirrored via the fifth transistor 344 and the second transistor 390, and a substantially equal portion of the second current 312 may be mirrored via the fifth transistor 324 and the third transistor 392. The second current 312 may be a slope-adjustable PTAT current that is dynamically adjustable.

The second bias circuit 308 may be configured to adjust a slope of the second current 312 by adjusting contributions of PTAT reference current ($I_{PTAT0}$) and the band-gap reference current ($I_{BG0}$) to the second current 312 based on the second stage selection code. For example, the second bias circuit 308 may set the multiplication factor $N_1$ associated with the fifth current source 322 and the sixth current source 324 based on the second stage selection code. The second stage selection code may be a digital code that indicates a number of enabled current contributing stages within the second bias circuit 308, as further described with reference to FIG. 4. In an exemplary embodiment, the slope of the second current 312 may be linear (or substantially linear). In another exemplary embodiment, the slope of the second current 312 may be nonlinear (e.g., piecewise linear), as further described with reference to FIG. 5.

By setting the slopes of the first current 310 and the second current 312 based on the stage selection codes, the slopes of the first current 310 and the second current 312 may be adjusted after the design phase is complete. The stage selection codes may be provided/generated by a processor, or other control logic, and may be modified (e.g., changed) after the design phase is complete. For example, after the design phase is complete (e.g., after values of circuit elements, such as the components within the first device 302 and the second device 304, have been selected and after the circuit elements are disposed in the corresponding devices 302, 304), the first slope of the first current 310 may be modified (e.g., adjusted) based on a value of the first stage selection code, and the second slope of the second current 312 may be separately modified based on a value of the second stage selection code.

The first stage selection code may be selected to set the first slope of the first current 310 to reduce gain variance and/or noise variance caused by temperature changes at the first device 302. For example, the gain and the noise figure of the first device 302 may be measured across a particular temperature range using an initial value of the first slope. Based on the measurements of the gain and the noise figure, a first target value for the first slope may be determined to reduce gain variance and/or noise variance. The first slope may be set to approximate the first target value via selection of the first stage selection code.

Selection of the second stage selection code may proceed in a similar manner with respect to the second device 304. For example, based on measurements of the gain and the noise figure of the second device 304, a second target value may be determined to reduce the gain variance and/or the noise figure variance of the second device 304. The second slope of the second current 312 may be set to approximate the second target value via selection of the second stage selection code. By setting the first slope and the second slope to different values, different temperature dependencies of the first device 302 and the second device 304 may be compensated for, as further described herein.

Magnitudes of the currents 310, 312 may be based on magnitudes of the currents generated by the current sources 314-318, 320-324, respectively. Because the currents generated by the current sources 314-324 are based on the PTAT reference current ($I_{PTAT0}$) and the band-gap reference current ($I_{BG0}$), the magnitudes of the currents 310, 312 (e.g., the slope-adjustable PTAT currents) may be determined as functions of the PTAT reference current ($I_{PTAT0}$) and the band-gap reference current ($I_{BG0}$). As explained above, the first current source 314 and the fourth current source 320 are configured to generate the first source current and the third source current, respectively, having the magnitude of the PTAT reference current ($I_{PTAT0}$) multiplied by the multiplication factor M. Thus, the first source current and the third source current, designated $I_{PTAT}$, may be expressed as:

$$I_{PTAT}=M*I_{PTAT0} \quad \text{(Equation 1).}$$

As explained above, the PTAT reference current ($I_{PTAT0}$) is temperature-dependent. For example, a magnitude of the PTAT reference current ($I_{PTAT0}$) may be related to a constant ($\alpha$) and a difference between a given temperature (T) and a particular temperature ($T_0$) (e.g., a designated temperature, such as room temperature). In an exemplary embodiment, the band-gap reference current ($I_{BG0}$) may be determined so that the magnitude of the band-gap reference current ($I_{BG0}$) is approximately equal to the magnitude of the PTAT reference current ($I_{PTAT0}$) at the particular temperature ($T_0$) (e.g., at room temperature). By selecting the band-gap reference current ($I_{BG0}$) so that the PTAT reference current ($I_{PTAT0}$) and the band-gap reference current ($I_{BG0}$) have the same magnitude at the particular temperature ($T_0$), the PTAT reference current ($I_{PTAT0}$) may be expressed as:

$$I_{PTAT0}=\alpha*(T-T_0)+I_{BG0} \quad \text{(Equation 2).}$$

Substituting for the PTAT reference current ($I_{PTAT0}$) into Equation 1 results in the first source current and the third source current being expressed as:

$$I_{PTAT}=M*\alpha*(T-T_0)+M*I_{BG0} \quad \text{(Equation 3).}$$

The first current 310 depends on the currents generated by the current sources 314-318. As illustrated in FIG. 3, the first current source 314 and the second current source 316 source current, and the third current source 318 sinks current. Thus, the magnitude of the first current 310, designated as $I_{kPTAT}$, may be expressed as:

$$I_{kPTAT}=M*I_{PTAT0}N_0*I_{PTAT0}-N_0*I_{BG0} \quad \text{(Equation 4).}$$

Substituting for the PTAT reference current ($I_{PTAT0}$) into Equation 4 results in the first current 310 ($I_{kPTAT}$) being expressed as:

$$I_{kPTAT}=(M+N_0)*\alpha*(T-T_0)+M*I_{BG0} \quad \text{(Equation 5).}$$

Based on Equation 5, a slope (e.g., a change in current magnitude with respect to a change in temperature) of the first current 310 ($I_{kPTAT}$) is $(M+N_0)*\alpha*(T-T_0)$. Similarly, based on Equation 3, a slope of the first source current ($I_{PTAT}$) is $M*\alpha*(T-T_0)$. A first slope ratio of the first slope of the first current 310 (e.g., a ratio of the slope of the first current ($I_{kPTAT}$) to the "reference" slope of the first source current ($I_{PTAT}$)) may be expressed by as:

$$\frac{\text{Slope of } IkPTAT}{\text{Slope of } IPTAT} = \frac{(M+N0)\alpha(T-T0)}{M\alpha(T-T0)}. \quad \text{(Equation 6)}$$

Reducing Equation 6 results in the first slope ratio having a value of $1+N_0/M$. Equations 1-6 may be similarly applied to the second bias circuit 308, using the second multiplication factor $N_1$ based on the second stage selection code. For example, application of Equations 1-6 to the second bias circuit 308 yield a second slope ratio having a value of $1+N_1/M$.

Because the first slope ratio depends on the first multiplication factor $N_0$ and the second slope ratio depends on the second multiplication factor $N_1$, the first slope ratio may be set independently of the second slope ratio (e.g., the slopes of the currents 310, 312 may be set based on distinct values). In order to reduce the variance in the gain and/or the variance in the noise figure, the first slope of the first current 310 and the second slope of the second current 312 may be selected such that each of the first slope ratio and the second slope ratio is greater than one. In an exemplary embodiment, the first slope ratio and the second slope ratio are each set at values in a particular range (e.g., approximately between 1.22 and 1.93) using the first selection code and the second selection code. Setting the slope ratios within the particular range may enable a reduction of gain variance and/or a reduction of noise figure variance across the particular temperature range. In an exemplary embodiment, the second slope of the second current 312 may be greater than the first slope of the first current 310 (as indicated by the second slope ratio being greater than the first slope ratio). In other exemplary embodiments, the slope of the first current 310 may be greater than the slope of the second current 312 (as indicated by the first slope ratio being greater than the second slope ratio).

During operation of the circuit 300, the first bias circuit 306 may provide the first current 310 to the first device 302 and the second bias circuit 308 may provide the second current 312 to the second device 304. The slopes of the currents 310, 312 may be set based on the first stage selection code and the second stage selection code, respectively. The values of the stage selection codes may be selected to reduce gain variance and/or the noise figure variance. Based on receiving the currents 310, 312, the first device 302 and the second device 304 may amplify a received input signal to generate differential signals at the output terminals 352, 354.

Because the slopes of the first current 310 and the second current 312 are adjusted using independent stage selection codes, different temperature dependencies of the first device 302 and of the second device 304 may be individually and independently compensated for to reduce gain variance and/or noise figure variance. Further, by adjusting the slopes of the first current 310 and the second current 312 based on measured values (e.g., after the design phase), as opposed to predicted values (as determined during the design phase), the gain variance and/or the noise figure variance may be reduced based on actual (e.g., measured values) as opposed to predicted values. As a non-limiting example, by generating the first current 310 and the second current 312 having slope ratios of 1.44 and 1.66, respectively, gain variance may be reduced approximately 6.5 decibels (dB) as compared to a 2 dB reduction associated with generating a single fixed-slope PTAT current.

As another example, the first slope of the first current 310 may be set at a higher value than the second slope of the second current 312 to reduce the variance in noise figure at high temperatures while providing stability at low temperatures. For example, providing the first current 310 with a greater slope than the second current 312 may enable the devices 302, 304 to meet a target gain while limiting current consumption such that the devices 302, 304 do not become unstable at low temperatures. Due to the reduced gain variance and/or the reduced noise figure variance, the devices 302, 304 may be used in highly sensitive receivers, such as global positioning system (GPS) receivers.

Figure 4:
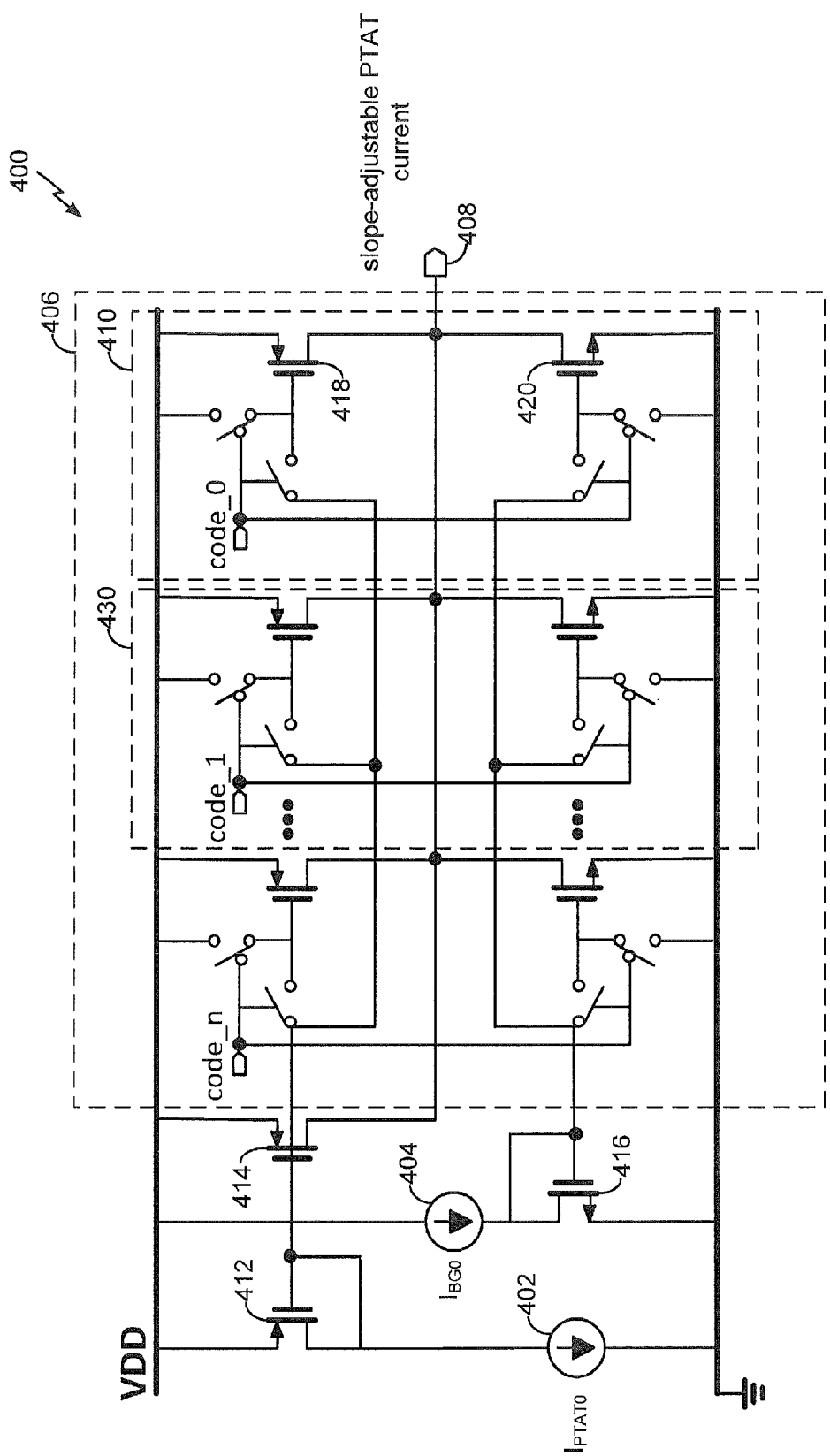
FIG. 4 is an exemplary illustrative embodiment of a bias circuit that is operable to generate a slope-adjustable proportional-to-absolute temperature (PTAT) current.

Referring to FIG. 4, an exemplary illustrative embodiment of a bias circuit 400 that is operable to generate a slope-adjustable PTAT current is shown. The bias circuit 400 may correspond to the first bias circuit 306 of FIG. 3 or the second bias circuit 308 of FIG. 3. The bias circuit 400 may be configured to generate a slope-adjustable PTAT current 408 based on the PTAT reference current ($I_{PTAT0}$) and the band-gap reference current ($I_{BG0}$) using current contributing stages 406. The slope-adjustable PTAT current 408 may correspond to the first current 310 of FIG. 3 or the second current 312 of FIG. 3.

The bias circuit 400 includes a first current source 402 configured to generate the PTAT reference current ($I_{PTAT0}$), a second current source 404 configured to generate the band-gap reference current ($I_{BG0}$), transistors 412-416, and the current contributing stages 406. A first transistor 412 and a second transistor 414 may be p-type metal oxide semiconductor (PMOS) transistors and may be configured to operate as a current mirror. The second transistor 414 may be sized such that a current mirrored via the second transistor 412 has a magnitude of the PTAT reference current ($I_{PTAT0}$) multiplied by the first multiplication factor M. Thus, the second transistor 414 may contribute a source current having a magnitude of $M*I_{PTAT0}$ to the slope-adjustable PTAT current 408.

The first transistor 412 and a third transistor 416 may each be configured with one or more corresponding transistors in the current contributing stages 406 to operate as additional current mirrors. The additional current mirrors may be configured such that a current provided by the current contributing stages 406 has a magnitude of $N*I_{PTAT0}-N_{IBG0}$, where N is a second multiplication factor (e.g., N may correspond to $N_0$ or $N_1$ of FIG. 3). The second multiplication factor N may be adjustable based on a stage selection code. Based on the second transistor 414 and the current contributing stages 406, the magnitude of the slope-adjustable PTAT current output 408 may be $M*I_{PTAT0}+N*I_{PTAT0}-N*I_{BG0}$.

The current contributing stages 406 may be configured to set the second multiplication factor N (e.g., to set the magnitude of the slope-adjustable PTAT current 408) based on the stage selection code. In an exemplary embodiment, the current contributing stages 406 correspond to a digital-to-analog converter (DAC). For example, the current contributing stages 406 may adjust a magnitude of the slope-adjustable PTAT current 408 based on a digital control signal (e.g., the stage selection code). The stage selection code may correspond to the first stage selection code of FIG. 3 or the second stage selection code of FIG. 3. The stage selection code may have n+1 bits and the current contributing stages 406 may include n+1 stages, where n is an integer that is greater than or equal to zero. Each current contributing stage of the current contributing stages 406 may be responsive to a corresponding bit of the stage selection code.

An illustrative first current contributing stage 410 may include a plurality of switches, a pair of transistors 418 and 420, and an input configured to receive a first bit (e.g., code_0) of the stage selection code. The first current contributing stage 410 may be responsive to code_0 to adjust the second multiplication factor N. For example, the first current contributing stage 410 may adjust the second multiplication factor N by mirroring the PTAT reference current ($I_{PTAT0}$) and the band-gap reference current ($I_{BG0}$) based on a value of code_0. In an exemplary embodiment, the first transistor 418 may be included in a PTAT current binary DAC. For example, the first transistor 418 of the first current contributing stage 410 and the first transistor 412 may be configured to act as a first current mirror to mirror the PTAT reference current ($I_{PTAT0}$) in the first current contributing stage 410. In an exemplary embodiment, a second transistor 420 may be included in a band-gap current binary DAC. For example, the second transistor 420 of the first current contributing stage 410 and the third transistor 416 may be configured to act as a second current mirror to mirror the band-gap reference current ($I_{BG0}$) in the first current contributing stage 410.

When code_0 has a value of zero, the plurality of switches may disable the transistors 418, 420 so that no current is mirrored by the transistors 418, 420. When code_0 has a value of one, the plurality of switches may enable the transistors 418, 420 so that the PTAT reference current ($I_{PTAT0}$) and the band-gap reference current ($I_{BG0}$)) are mirrored in the first current contributing stage 410. Accordingly, when code_0 has the value of one, the first current contributing stage 410 increases the second multiplication factor N.

Each current contributing stage of the current contributing stages 406 may include similar circuit components and may operate in a substantially similar manner with respect to a corresponding bit of the stage selection code (e.g., code_0 to code_n) to adjust (e.g., modify) the second multiplication factor N. Adjusting the second multiplication factor N may adjust a slope (e.g., a current magnitude with respect to temperature) of the slope-adjustable PTAT current 408 while the magnitude of the current 408 is kept the same at a designated temperature ($T_0$).

In an exemplary embodiment, the stage selection code may be a two-bit binary code (e.g., code_1 and code_0) and two current contributing stages 410, 430 may be responsive to the stage selection code. In this particular embodiment, the slope of the slope-adjustable PTAT current 408 may be set to one of four values based on which current contributing stages of the first current contributing stage 410 and a second current contributing stage 430 are enabled. The slope of the slope-adjustable PTAT current 408 may be set between 1.22 and 1.93 times the PTAT reference current ($I_{PTAT0}$) based on the value of the stage selection code.

For example, the slope of the slope-adjustable PTAT current 408 may be 1.12 times the slope of the PTAT reference current ($I_{PTAT0}$) when the stage selection code is "00" due to no current contributing stages of the one or more current contributing stages 406 being enabled. In this example, the slope may be 1.12 times the slope of the PTAT reference current ($I_{PTAT0}$) based on the transistors 412, 414 without any contribution from the current contributing stages 406. Alternatively, the slope of the slope-adjustable PTAT current 408 may be 1.39 times the slope of the PTAT reference current ($I_{PTAT0}$) when the stage selection code is "01" due to the first current contributing stage 410 being enabled. In the present example, the first current contributing stage 410 may increase the slope of the slope-adjustable PTAT current 408 by approximately 0.27 times the slope of the PTAT reference current ($I_{PTAT0}$).

As another example, the slope of the slope-adjustable PTAT current 408 may be 1.66 times the slope of the PTAT reference current ($I_{PTAT0}$) when the stage selection code is "10" due to the second current contributing stage 430 being enabled. The slope of the slope-adjustable PTAT current 408 may be 1.93 times the slope of the PTAT reference current ($I_{PTAT0}$) when the stage selection code is "11" due to both current contributing stages 410, 430 being enabled. In other exemplary embodiments, the number of stages may be more than two and the stage selection code may have more than two bits. Accordingly, in other exemplary embodiments, the slope of the slope-adjustable PTAT current 408 may be set to other values based on the stage selection code.

Figure 5:
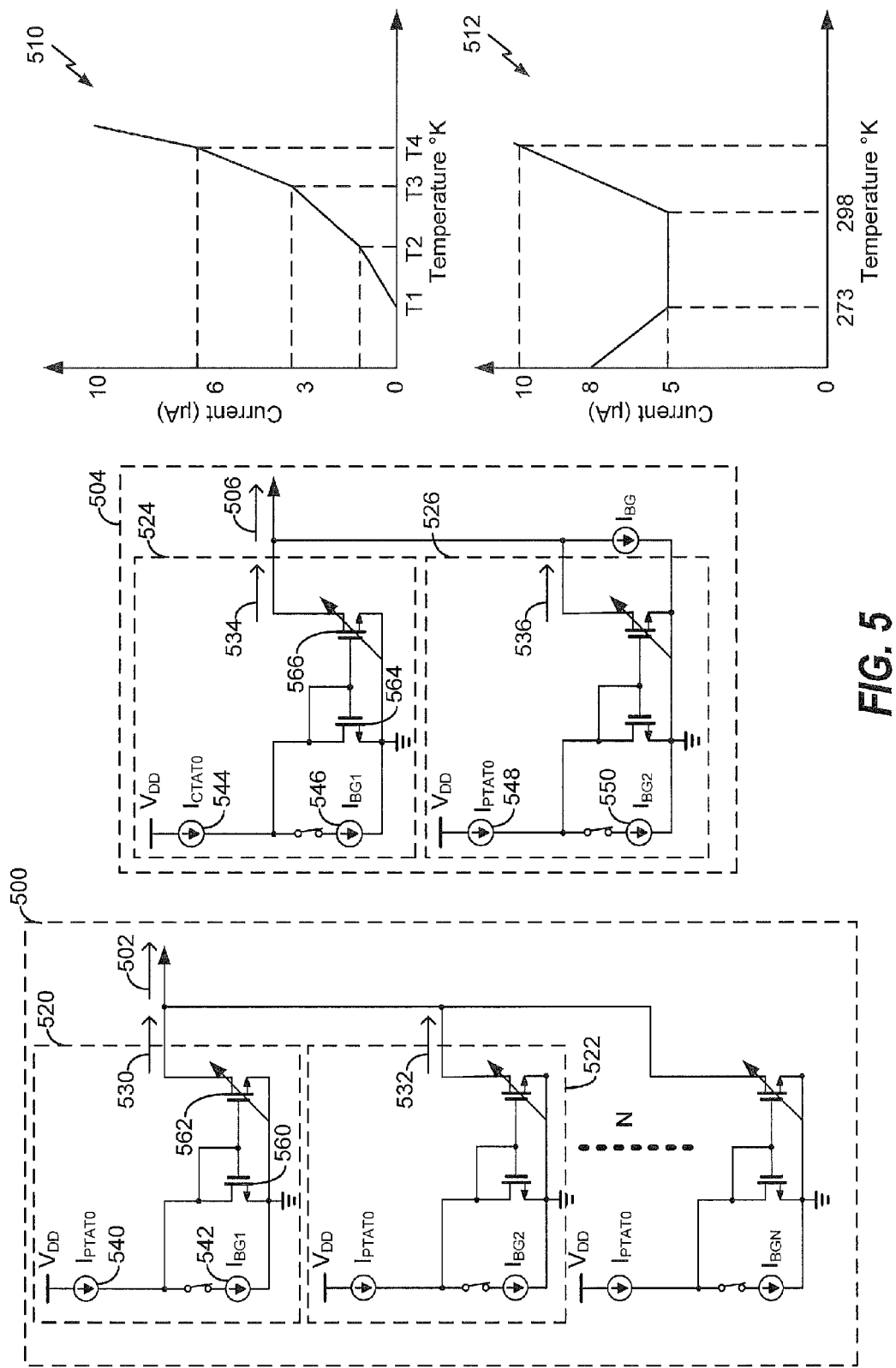
FIG. 5 depicts exemplary embodiments of current sources configured to generate reference currents having piece-wise linear slopes.

Referring to FIG. 5, two exemplary embodiments 500, 504 of current sources configured to generate reference currents having piecewise linear slopes are shown. The current sources 500, 504 may correspond one or more of the current sources depicted in FIG. 3. The first current source 500 is configured to output a first reference current 502 and the second current source 504 is configured to output a second reference current 506. The first reference current 502 or the second reference current 506 may correspond to the PTAT reference current ($I_{PTAT0}$) in FIGS. 3-4.

The first current source 500 includes a plurality of current contributing stages, including a first stage 520 and a second stage 522. The first stage 520 includes a first current source 540 configured to generate the PTAT reference current ($I_{PTAT0}$), a second current source 542 configured to generate a first band-gap reference current ($I_{BG1}$), a switch, and a pair of transistors (e.g., a first transistor 560 and a second transistor 562) configured as a current mirror to provide a first stage current 530. The second transistor 562 may be a set of one or more transistors configured to act as a variable width transistor.

In an exemplary embodiment, the band-gap reference current ($I_{BG1}$) 542 may be determined so that the magnitude of the band-gap reference current ($I_{BG1}$) is approximately equal to the magnitude of the PTAT reference current ($I_{PTAT0}$) 540 at the particular temperature (T1). The first stage current 530 may be a "rectified" current. For example, when temperature (T) is less than T1, the transistors 560, 562 may not mirror current since the negative biasing current ($I_{PTAT0} - I_{BG1}$) to the diode-connected transistor 560 becomes rectified by the transistor 560. (e.g., the first stage current 530 has a magnitude of zero). When the temperature is greater than or equal to the first temperature (T1), the magnitude of the first stage current 530 may be approximately equal to the difference of the PTAT reference current ($I_{PTAT0}$) and the first band-gap reference current ($I_{BG1}$) (e.g., $I_{PTAT0} - I_{BG1}$). The switch may be responsive to a corresponding bit of a slope selection value to enable (or disable) generation of the first reference current 502.

The first stage current 530 at temperatures greater than (T1) may have a linear slope (e.g., a change in current magnitude with respect to a change in temperature). Other stages of the first current source 500 may function similarly to the first stage 520, but with respect to different temperatures than the first temperature (T1) and with respect to different band-gap currents. For example, a magnitude of a second stage current 532 of the second stage 522 is zero when the temperature is less than a second temperature (T2). The magnitude of the second stage current 532 may be approximately equal to the difference of the PTAT reference current ($I_{PTAT0}$) and a second band-gap reference current ($I_{BG2}$) (e.g., $I_{PTAT0} - I_{BG2}$) when the temperature is greater than or equal to the second (T2). The stage currents 530, 532 combine to generate the first reference current 502. For example, the first reference current 502 may include a combination of the first stage current 530, the second stage current 532, and stage currents from other stages (when the first current source 500 includes more than two stages).

The first reference current 502 may have a nonlinear (e.g., a piecewise linear) slope. For example, the slope of the first reference current 502 is shown by a first chart 510. As illustrated in the first chart 510, the first reference current 502 has a first slope value in a first temperature region (e.g., from the first temperature (T1) to the second temperature (T2)), a second slope value in a second temperature region (e.g., from the second temperature (T2) to a third temperature (T3)), a third slope value in a third temperature region (e.g., from the third temperature (T3) to a fourth temperature (T4)), and a fourth slope value in a fourth temperature region (e.g., above the fourth temperature (T4)). The first slope value, the second slope value, the third slope value, and the fourth slope value may be different values. Each of the slope values may be associated with one or more corresponding stages of the first current source 500. For example, the first slope value may be based on the first stage current 530, the second slope value may be based on a combination of the first stage current 530 and the second stage current 532, etc. Although only two stages have been described, the first current source 500 may include any number of stages (e.g., any number of band-gap reference currents) and the slope of the first reference current 502 may have any number of corresponding slope values.

The second current source 504 may be configured to generate the second reference current 506. In an exemplary embodiment, the second current source 504 may include two current contributing stages (e.g., a first stage 524 and a second stage 526) and a current source configured to output a band-gap current ($I_{BG}$), which may be used to normalize the second reference current 506 to a particular value. The first stage 524 includes a first current source 544 configured to generate a complimentary-to-absolute temperature (CTAT) reference current ($I_{CTAT0}$), a second current source 546 configured to generate a first band-gap reference current ($I_{BG1}$), a switch, and a pair of transistors 564, 566 configured as a current mirror to provide a first stage current 534. The transistor 566 may be a set of one or more transistors configured to act as a variable width transistor. As used herein, a CTAT reference current refers to a reference current that has a complimentary (e.g., negative) temperature-dependency. For example, a change in magnitude of the CTAT reference current is proportionally related to a temperature change, where the change in magnitude of the CTAT reference current has an opposite polarity of the temperature change.

The switch may be responsive to a corresponding bit of a slope selection value to enable (or disable) generation of the second reference current 506. The first stage current 534 may be a "rectified" current. For example, when a temperature exceeds 273° K, the transistors 564, 566 may not mirror current (e.g., the first stage current 534 has a magnitude of zero). When the temperature of the second current source 504 is less than 273° K, the magnitude of the first stage output current 534 may be approximately equal to the difference of the CTAT reference current ($I_{PTAT0}$) and the first band-gap reference current ($I_{BG1}$) (e.g., $I_{CTAT0}-I_{BG1}$). The first stage current 534 may have a linear slope (or substantially linear slope) having a negative value when the temperature is less than 273° K.

The second stage 526 may function similarly to the first stage 524, but with respect to different temperatures than 273° K and with respect to a different current. For example, the second stage 526 may generate a second stage current 536 having a magnitude of zero when the temperature is less than 298° K. The magnitude of the second stage current 536 may be approximately equal to the difference of the PTAT reference current ($I_{PTAT0}$) and a second band-gap reference current ($I_{BG2}$) (e.g., $I_{PTAT0}-I_{BG2}$) when the temperature exceeds 298° K. The first stage current 534 and the second stage output current 536 may be combined to generate the second reference current 506.

The second reference current 506 may have a nonlinear (e.g., piecewise linear) slope. For example, the slope of the second reference current 506 is shown by a second chart 512. As illustrated in the second chart 512, the second reference current 506 has a first slope value in a first temperature region (e.g., less than 273° K), a second slope value in a second temperature region (e.g., between 273° K and 298° K), and a third slope value in a third temperature region (e.g., greater than 298° K). Thus, the first temperature region may be lower than the second temperature region and the third temperature region. For example, the first temperature region may correspond to cooler temperatures than the temperatures associated with the second temperature region and the third temperature region. The first slope value may be a negative slope value, the second slope value may be a zero value, and the third slope value may be a positive slope value. Thus, the slope of the second reference current 506 may have a positive slope in a particular temperature region (e.g., the third temperature region) and a negative slope in a different temperature region (e.g., the first temperature region).

Although only two stages are illustrated as being included in the second current source 504, any number of stages may be included and the slope of the second reference current 506 may have any number of corresponding slope values. For example, one or more stages of the first current source 500 may be included in the second current source 504 to generate the second reference current 506 having a piecewise linear slope that includes multiple slope values, where one or more of the slope values is a negative slope value.

Using the reference currents 502, 506 (e.g., a current having a piecewise linear slope) as the PTAT reference current ($I_{PTAT0}$) may enable a reduction in gain variance and/or a reduction in noise figure variance as compared to using a current having a single linear slope. For example, a PTAT current having a large slope value may reduce variance at high temperatures; however, the large slope value may reduce current magnitude at low temperatures. A small current magnitude at low temperatures may be insufficient to bias an LNA (e.g., the LNA becomes unstable at low temperatures due to the small current magnitude). Using a current having a piecewise linear slope may enable the LNA to receive a sufficiently high current magnitude at low temperatures and to receive a high current magnitude at high temperatures to enable a reduction in the variance at the high temperatures.

By using the reference currents 502, 506 as the PTAT reference current ($I_{PTAT0}$), the first slope of the first current 310 of FIG. 3 may be piecewise linear based on a temperature of the first device 302. In a similar manner, the second slope of the second current 312 of FIG. 3 may be piecewise linear based on a temperature of the second device 304. For example, by using a current with a first slope value (e.g., a small value or a negative value) at low temperatures, a relatively large current may be applied to the LNA to reduce noise figure variation (e.g., improve LNA stability). In addition, by using a second slope value (e.g., a large value) at high temperatures, a current having a magnitude that is greater than a magnitude projected by the first slope value at the high temperature may be applied to the LNA to reduce increased noise variation caused by the high temperatures. Thus, the multi-slope configuration may reduce the variance at high temperatures and prevent the LNA from becoming unstable at low temperatures.

Referring to FIG. 6, particular charts depicting noise figure gains for fixed-slope PTAT reference currents and multi-slope PTAT reference currents are shown. A first chart 602 depicts noise figure gains for multi-slope PTAT reference currents, and a second chart 604 depicts noise figure gains for fixed-slope PTAT reference currents. The multi-slope PTAT reference current may be generated according to the techniques described with respect to FIG. 5.

In the exemplary illustrative embodiments, an improvement of approximately 0.3 decibels (dBs) is shown with respect to high temperatures. For example, at 110 degrees Celsius (e.g., 383 degrees Kelvin), the noise figure gain is approximately 3.07 dB for the multi-slope PTAT reference current and approximately 3.36 dB for the fixed-slope PTAT reference current. It will also be appreciated that a magnitude of a bias current based on the multi-slope PTAT reference current at room temperature (e.g., 25 degrees Celsius) is substantially the same as a magnitude of a bias current based on the fixed-slope PTAT reference current at room temperature. Thus, the charts 602, 603 depicted in FIG. 6 illustrate noise figure degradation for a multi-slope PTAT reference current that is less than the noise figure degradation for a fixed-slope PTAT reference current at corresponding temperatures.

Figure 7:
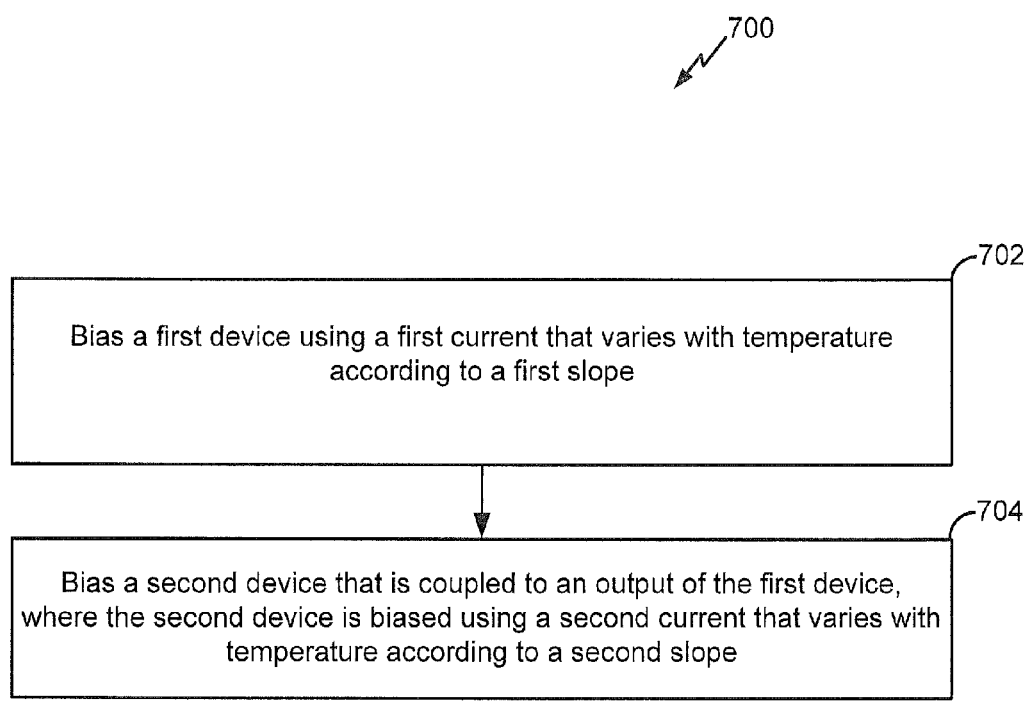
FIG. 7 is a flowchart that illustrates an exemplary embodiment of a method for reducing gain variance and/or noise figure variance of a low noise amplifier.

Referring to FIG. 7, a flowchart that illustrates an exemplary embodiment of a method for reducing gain variance and/or noise figure variance of a low noise amplifier is shown. In an exemplary illustrative embodiment, the method 700 may be performed using the wireless device 110 of FIGS. 1-2, the circuit 300 of FIG. 3, the bias circuit 400 of FIG. 4, the circuits 500, 504 of FIG. 5, or any combination thereof.

The method 700 includes biasing a first device using a first current that varies with temperature according to a first slope, at 702. For example, referring to FIG. 3, the first bias circuit 306 may generate the first current 310 (e.g., the first slope adjustable PTAT current) that varies with temperature according to the first slope. The first bias circuit 306 may adjust the first slope of the first current 310 based on a first stage selection code. By adjusting the first slope of the first current 310 based on the first stage selection code, the first bias circuit 306 enables the first slope to be adjusted after a design phase of the circuit 300 has been completed. The first slope of the first current 310 may be set to reduce a variance in the gain and/or a variance in the noise figure caused by temperature changes of the first device 302. For example, the first slope may be determined as a first function of a PTAT reference current and a band-gap reference current.

A second device that is coupled to an output of the first device may be biased, at 704. For example, referring to FIG. 3, the second bias circuit 308 may generate a second current 312 that varies with temperature according to the second slope. The second current 312 may correspond to a second slope adjustable PTAT current that biases the second device 304. The first slope adjustable PTAT current may be controlled independently of the second slope adjustable PTAT current. For example, the second slope of the second current 312 may be set to adjust a negative-transconductance value generated by the second device 304 (e.g., the negative-transconductance stage) to incrementally adjust (e.g., boost) the gain of the first device 302 (e.g., the LNA). Adjusting the transconductance value generated by the second device 304 may reduce a variance in the gain and/or a variance in noise figure caused by temperature changes of the second device 304. The second slope may be determined as a second function of the PTAT reference current and a band-gap reference current.

The method 700 may also include receiving a first digital code and controlling the first slope adjustable PTAT current based on the first digital code. For example, referring to FIG. 3, the first bias circuit 306 may adjust a slope of the first current 310 by adjusting contributions of the PTAT reference current ($I_{PTAT0}$) and the band-gap reference current ($I_{BG0}$) to the first current 310 based on the first stage selection code. The first stage selection code may be a digital code that indicates a number of enabled current contributing stages within the first bias circuit 306.

The method 700 may also include receiving a second digital code and controlling the second slope adjustable PTAT current based on the second digital code. For example, referring to FIG. 3, the second bias circuit 308 may a slope of the second current 312 by adjusting contributions of PTAT reference current ($I_{PTAT0}$) and the band-gap reference current ($I_{BG0}$) to the second current 312 based on the second stage selection code. The second stage selection code may be a digital code that indicates a number of enabled current contributing stages within the second bias circuit 308.

The method 700 of FIG. 7 may adjust the slopes of the first current 310 and the second current 312 separately (e.g., individually) to compensate for temperature dependencies associated with the first device 302 and temperature dependencies associated with the second device 304, respectively. Because the temperature dependencies of the first device 302 and the second device 304 may be different, using individual slope-adjustable currents (e.g., currents 310 and 312) may enhance variance (e.g., gain variance and/or noise figure variance) reduction with respect to each device 302, 304 over a particular temperature range as compared to variance reduction associated with providing a single fixed-slope PTAT reference current to first device 302 and to the second device 304.

In conjunction with the described embodiments, an apparatus includes means for biasing a low noise amplifier using a first current that varies with temperature according to a first slope. For example, the means for biasing the low noise amplifier may include the wireless device 110 of FIGS. 1-2, the first bias circuit 306 of FIG. 3, the first current source 314 of FIG. 3, the second current source 316 of FIG. 3, the third current source 318 of FIG. 3, the fourth transistor 340 of FIG. 3, the bias circuit 400 of FIG. 4 and the components therein, the first current source 500 of FIG. 5 and the components therein, the second current source 504 of FIG. 5 and the components therein, one or more other devices, circuits, modules, or instructions to bias the low noise amplifier, or any combination thereof.

The apparatus may also include means for biasing a load of the low noise amplifier using a second current that varies with temperature according to a second slope. For example, the means for biasing the load may include the wireless device 110 of FIGS. 1-2, the second bias circuit 308 of FIG. 3, the fourth current source 320 of FIG. 3, the fifth current source 322 of FIG. 3, the sixth current source 324 of FIG. 3, the fifth transistor 344 of FIG. 3, the bias circuit 400 of FIG. 4 and the components therein, the first current source 500 of FIG. 5 and the components therein, the second current source 504 of FIG. 5 and the components therein, one or more other devices, circuits, modules, or instructions to bias the load, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a first bias circuit including multiple current contribution stages, the first bias circuit configured to generate a first current that varies with temperature according to a first adjustable slope;
   a second bias circuit configured to generate a second current that varies with temperature according to a second slope;
   a low noise amplifier including a transconductance stage that is responsive to an output of the first bias circuit; and
   a load coupled to an output of the low noise amplifier and responsive to an output of the second bias circuit.

2. The apparatus of claim 1, wherein the load comprises a selectivity boosting circuit that comprises an active circuit and at least one passive circuit element.

3. The apparatus of claim 1, wherein the second bias circuit includes multiple current contribution stages coupled to a second output node of the second bias circuit.

4. The apparatus of claim 1, wherein each of the current contribution stages of the first bias circuit includes:
   a first transistor coupled to a first output node of the first bias circuit and configured to provide a proportional-to-absolute temperature (PTAT) current to the first output node;
   a second transistor coupled to the first output node and configured to provide a band-gap current from the first output node; and
   an enable circuit to selectively activate the first transistor and the second transistor.

5. The apparatus of claim 1, wherein the first adjustable slope is based on a first temperature of the low noise amplifier, wherein the second slope is based on a second temperature of the load, wherein the second slope is negative when the second temperature is within a first temperature region, and wherein the second slope is positive when the second temperature is within a second temperature region.

6. The apparatus of claim 5, wherein the first temperature region is lower than the second temperature region.

7. The apparatus of claim 1, wherein the transconductance stage comprises a transistor responsive to the first current.

8. The apparatus of claim 1, wherein the first bias circuit comprises:
   a proportional-to-absolute temperature (PTAT) current source operable to generate a PTAT current;
   a band-gap current source operable to generate a band-gap current;
   a first plurality of transistors responsive to a first stage selection code, wherein the first plurality of transistors are operable to adjust a magnitude of the PTAT current based on the first stage selection code; and
   a second plurality of transistors responsive to a second stage selection code, wherein the second plurality of transistors are operable to adjust a magnitude of the band-gap current based on the second stage selection code.

9. The apparatus of claim 8, wherein the first plurality of transistors corresponds to a PTAT current binary digital-to-analog convertor (DAC), and wherein the second plurality of transistors corresponds to a band-gap current binary DAC.

10. The apparatus of claim 1, wherein the first slope is based on a proportional-to-absolute temperature (PTAT) reference current having a reference slope, and wherein a ratio of the first slope to the reference slope is greater than one.

11. The apparatus of claim 10, wherein the first slope is greater than the second slope.

12. The apparatus of claim 1, wherein the first bias circuit is configured to enable one or more of the multiple current contribution stages based on a first input to generate the first current.

13. The apparatus of claim 12, wherein the second bias circuit is configured to enable one or more of multiple current contribution stages of the second bias circuit based on a second input to generate the second current.

14. An apparatus comprising:
   means for biasing a low noise amplifier using a first current that varies with temperature according to a first slope; and
   means for biasing a load of the low noise amplifier using a second current that varies with temperature according to a second slope, wherein the first slope is adjustable based on a first digital code, and wherein the second slope is adjustable based on a second digital code.

15. The apparatus of claim 14, wherein the first slope is determined as a first function of a proportional-to-absolute temperature (PTAT) reference current and a band-gap reference current, and wherein the second slope is determined as a second function of the PTAT reference current and the band-gap reference current.

16. The apparatus of claim 14, wherein the first slope is piecewise linear, wherein the second slope is piecewise linear, wherein the second slope is negative when a temperature of the load is within a first temperature region, and wherein the second slope is positive when the temperature of the load is within a second temperature region.

17. The apparatus of claim 14, wherein the load comprises a selectivity boosting circuit.

18. A method comprising:
   biasing a first device using a first current that varies with temperature according to a first slope;
   biasing a second device that is coupled to an output of the first device, the second device biased using a current that varies with temperature according to a second slope, wherein at least one of the first slope or the second slope is adjustable;
   receiving a first digital code and controlling the first slope based on the first digital code; and
   receiving a second digital code and controlling the second slope based on the second digital code.

19. The method of claim 18, wherein controlling the first slope based on the first digital code includes selectively enabling a first number of current contributing stages in a first bias circuit according to a value of the first digital code, and wherein controlling the second slope based on the second digital code includes selectively enabling a second number of current contributing stages in a second bias circuit according to a value of the second digital code.

* * * * *